US006789159B1

(12) United States Patent
Carr et al.

(10) Patent No.: US 6,789,159 B1
(45) Date of Patent: Sep. 7, 2004

(54) SYSTEM AND METHOD FOR PROGRAMMING NON-VOLATILE MEMORY

(75) Inventors: Jeffrey Douglas Carr, San Diego, CA (US); Mark Buer, Gilbert, AZ (US)

(73) Assignee: Broadcom Corporation, Irvine, CA (US)

( * ) Notice: Subject to any disclaimer, the term of this patent is extended or adjusted under 35 U.S.C. 154(b) by 205 days.

(21) Appl. No.: 10/141,599

(22) Filed: May 8, 2002

(51) Int. Cl.[7] .............................................. G06F 12/00
(52) U.S. Cl. ....................... 711/103; 711/152; 711/163; 365/185.33; 710/14
(58) Field of Search ................................ 711/163, 152, 711/103; 348/734; 365/185.03–185.33; 710/14

(56) References Cited

U.S. PATENT DOCUMENTS

| | | | | | |
|---|---|---|---|---|---|
| 5,883,680 | A | * | 3/1999 | Nykerk | 348/734 |
| 5,991,197 | A | * | 11/1999 | Ogura et al. | 365/185.11 |
| 6,134,628 | A | * | 10/2000 | Hamadani | 711/103 |
| 6,185,127 | B1 | * | 2/2001 | Myers et al. | 365/185.03 |
| 6,360,260 | B1 | * | 3/2002 | Compliment et al. | 709/224 |
| 6,446,179 | B2 | * | 9/2002 | Baltar | 711/163 |
| 6,567,011 | B1 | * | 5/2003 | Young et al. | 340/825.69 |
| 6,629,047 | B1 | * | 9/2003 | Guliani et al. | 702/64 |
| 6,647,434 | B1 | * | 11/2003 | Kamepalli | 710/14 |

OTHER PUBLICATIONS

P.J. Lenior, "Functional Model for the DVB CPCM Framework," Royal Philips Electronics Presentation, Feb. 2002.
Rowan Vevers, "DVB Sub–Group on Commercial Requirements for Copy Protection Systems Report to the Eighteenth Meeting of the DVB Commercial Module (DVB–CM)," DVB Report, DVB–CP8(00)7, Oct. 2000.
Jeff Carr, "Response to DVB Call for Informtion Copy Protection and Digital Rights Management Technologies," Broadcom Corp., Oct. 2001.
"Call for Proposals for Content Protection & Copy Management Technologies," DVB, DVB Technical Module Sub–Group on Copy Protection Technologies, DVB CPT rev 1.2, Jul. 2001.
Ji et al., "Open Letter following Proposal DVB–CPY–719," Feb. 2002.
"SCTE Proposed Standard Head–end Implementation of OpenCAS™," Society of Cable Telecommunications Engineers, Inc., Engineering Committee, Digital Video Subcommittee, SCTE DVS 278r1, Jul. 2000.
"Data–Over–Cable Interface Specification," MCNS Holdings, L.P., Security Systems Specification, SP–SSI–I01–970506, 1997.
"DES CBC Packet Encryption," General Instrument Corp., SCTE DVS/042, Nov. 1996.

(List continued on next page.)

*Primary Examiner*—Nasser Moazzami
(74) *Attorney, Agent, or Firm*—McAndrews, Held & Malloy, Ltd.

(57) ABSTRACT

Systems and methods that may program a non-volatile memory for use in configuring features of a device, such as a set top box, for example, are disclosed. One method may include the steps of beginning a programming cycle; programming mode control bits of the non-volatile memory that correspond to configurations of features of the device; if an interruption occurs during the programming cycle, then rendering the non-volatile memory invalid; and if no interruption occurs during the programming cycle, then rendering the non-volatile memory operational.

16 Claims, 5 Drawing Sheets

OTHER PUBLICATIONS

"CD–Rom Based Application Software Consumer and SOHO Copying Trends," Merrill Research Associates, Apr. 2000.

"White Paper—The Ins and Outs of Content Delivery Networks," Stardust.com Inc., Dec. 2000.

"CD–Rom Unauthorized Copying Study Executive Summary," Merrill Research Associates, Apr. 1999.

"UDAC–M Host Link Specification, Part 1: Overview," Keitaide–Music Consortium, Ver. 0.9, Dec. 2000.

"Keitaide–Music Technical Specification Part I Overview," Keitaide–Music Consortium, Ver. 1.0, Dec. 2000.

"EPRS8 White Paper," SecureMedia, Inc., 2000.

William Raike "Detailed Supplemental Technical Description of the RPK Public–Key Cryptographic System," 1996.

Joseph M. Winograd, "Audio Watermarking Technologies for Protection of Digital Audio and Video—Presentation to DVD CPTWG," Verance Corporation, Sep. 2000.

John Paddleford, "Digital Rights Management—Protecting Your Content," Microsoft Corporation, undated.

"Common Interface Specification For Conditional Access and Other Digital Video Broadcasting Decoder Applications," DVB, DVB Document A017, May 1996.

"Call for Proposals for Content Protection & Copy Management Technologies," DVD, DVB Technical Module Sub–Group on Copy Protection Technologies, Rev. 12, Jul. 2001.

Bechtolsheim et al., "Responses to DVB–CP Requirements (DVB–CM283) for the OCCAM Open Conditional Content Access Management System," Cisco Systems, Inc. Oct. 2001.

"NetDRM Technology Response to DVD Call for Proposals for Content Protection & Copy Management Technologies," DVD, Matsushita Electric Industrial Co., Ltd., Oct. 2001.

"Proposal for Content Protection & Copy Management Technologies submitted to DVB (Digital Video Broadcasting," Veridian, Oct. 2001.

"Response to the DVB–CPT Call for Proposals for Content Protection & Copy Management Technologies," Royal Phillips Electronics N.V., Oct. 2001.

Kish et al., "An Information Paper in Response to the Call for Proposals Issued by the DVB Copy Protection Technologies Sub–Group of the DVB Technical Module," VWM Companies, Oct. 2001.

"Proposals for Content Protection and Copy Management Technologies," Sony International (Europe), Oct. 2001.

Olsthoorn et al., "Flexcop—A Flexible Copy Protection Framework," Flexcop, undated.

"Proposals for DVB Content Protection & Copy Management Technologies," Nokia Version 1.0, Oct. 2001.

"4C Entity Response to DVB CPT Call for Proposals Regarding Content Protection & Copy Management Technologies—Content Protection System Architecture—A comprehensive Framework for Content Protection, with CPPM and CPRM Technologies," 4C Entity, LLC, Oct. 2001.

"SmartRight Answer to the Call for Proposals for Content Protection & Copy Management Technologies," Thomson Multimedia et al., Oct. 2001.

"Answer to Call for Proposals for Content Protection & Copy Management Technologies," Thales Communication, Oct. 2001.

"IBM Response to DVB CPT Call for Proposals Regarding Content Protection & Copy Management: xCP Cluster Protocol," IBM, Oct. 2001.

"Digital Transmission Licensing Administrator's (DTLA) Response to DVB–CPT Call for Proposals Concerning Content Protection & Copy Management Technologies Protected Transport of Commercial Entertainment Content Using DTCP Technology," DTLA, 2001.

Winograd et al., "Audio Watermarking System for Content Protection within a DVB CPCM Environment," Verance Corporation, Oct. 2001.

"Proposed Baseline DVB–CPCM Response to DVB–CPT for Proposal Concerning Content Protection & Copy Technologies," Matsushita Electric Industrial Co., Ltd., Oct. 2001.

"Response to the Call for Proposals Content Protection and Copy Management Technologies by DVB Copy Protection Technologies Sub–Group of DVB Technical Module," Pioneer Corporation, Oct. 2001.

Kudumais, et al., "OPIMA/OCCAMM: A Solution to DVB Call for Proposals for Content Protection & Copy Management Technologies", OCCAMM, undated.

Capitant et al., "Digital Rights Management & Copy Protection An Information Paper in Response to the Call for Proposals Issued by the DVB Copy Technologies Sub–Group of the DVB Technical Module," Macrovision Corporation and Widevine Technologies Oct. 2001.

"Content Protection System Architecture A Comprehensive Framework for Content Protection, with High–Bandwidth Digital Content Protection (HDCP) Technology," Digital Content Protection, LLC, Oct. 2001.

"Digimarc Response to DVB_CPCM CFP: Watermarking Applications Information Paper," Digimarc Corporation, Oct. 2001.

Agnelli et al., "LAN Interconnection Via ATM Satellite Links for CAD Applications: The UNOM Experiment," undated.

Löytäbä et al., "Session Management Problems in Narrowband Interactive Services," Ad Hoc Group on Systems for Interactive Services, undated.

"Presentation to the TM," Simulcrypt Technical Group, undated.

"The DVB Project Promotion and Communication Module," DVB Project Office, Digital Video Broadcasting Presentation, undated.

"Digital Video Broadcasting (DVB); Support for Use of Scrambling and Digital Broadcasting Systems," European Telecommunications Standards Institute, ETSI Technical Report ETR 289, Oct. 1996.

"Digital Video Broadcasting (DVB); DVB SimulCrypt:; Part 1: Head–end architecture and synchronization," European Telecommunications Standards Institute, ETSI Technical Report TS 101 197–1 vI.1.1 Jun. 1997.

"IPsec Processing," Microsoft Corporation et al. 1998.

"IPsec Databases," Microsoft Corp. Document, undated.

* cited by examiner

Fig. 1

| Description | No. of Bits | Program Cycle Protection | CRC Protection | Visible | HW Dedicated |
|---|---|---|---|---|---|
| Device ID | 64 | YES | YES | YES | YES |
| Key 1 | 64 | YES | YES | NO | YES |
| Key 2 | 64 | YES | YES | NO | YES |
| Mode Control 0 | 16 | | | | |
| Encrypt_Engine | 1 | YES | YES | YES | YES |
| Data_Output | 1 | YES | YES | YES | YES |
| Test_Port_Diag | 1 | YES | YES | YES | YES |
| Reserved | 13 | YES | YES | YES | - |
| Mode Control 1 | 16 | | | | |
| Reserved | 7 | NO | NO | YES | - |
| Lock_A | 1 | NO | NO | YES | YES |
| Reserved | 7 | NO | NO | YES | - |
| Lock_B | 1 | NO | NO | YES | YES |
| CRC32 | 32 | YES | | NO | YES |
| Total Bit Count | 256 | | | | |

SYSTEM AND METHOD FOR PROGRAMMING NON-VOLATILE MEMORY

CROSS-REFERENCE TO RELATED APPLICATION

This application is related to and makes reference to U.S. patent application Ser. No. 10/141,197 entitled "System and Method for Configuring Device Features via Programmable Memory," filed on May 8, 2002.

INCORPORATION BY REFERENCE

The above-referenced U.S. patent application Ser. No 10/141,197 is hereby incorporated herein by reference in its entirety.

FIELD OF THE INVENTION

The present invention relates generally to systems and methods that program nonvolatile memory and, more specifically, to systems and methods that program non-volatile memory for use in configuring features of a device.

BACKGROUND OF THE INVENTION

Devices are generally manufactured with particular features and functions that meet the particular requirements of customers. However, this can be a costly undertaking especially where a wide variety of features and functions are available and customer preferences are equally diverse. To make a new line of devices that have the features or perform the functions according to each customer's specification would require a process involving additional design time and manufacture set up, and such a process would lack many of the efficiencies that result from economies of scale. Under these circumstances, such a customized solution may be impractical.

In addition, even if such a customized solution is implemented, it still lacks the flexibility to permit modification (e.g., enabling or disabling) of particular features or functions as customer needs change. Thus, a customer who would like to enable or to disable a particular feature or function would have to purchase another new line of devices that are designed and manufactured to incorporate the modifications.

On the other hand, a device with all of the available features and functions enabled might not necessarily meet the requirements of most customers. For example, some customers might not have the advanced systems capable of handling devices enabled with the highest levels of security or encryption. Accordingly, such a solution still would lack flexibility. Furthermore, a device with all of the available features and functions enabled may be more costly than most customers would be willing to pay.

Further limitations and disadvantages of conventional and traditional approaches will become apparent to one of skill in the art, through comparison of such systems with the present invention as set forth in the remainder of the present application with reference to the drawings.

What is needed, therefore, is a device that, for example, permits a customer to conveniently enable or disable allowed features and functions, but that also prohibits a customer from enabling non-allowed features and functions, in a cost efficient and secure manner.

SUMMARY OF THE INVENTION

Aspects of the present invention may be found in systems and methods that may configure features (functions) of a device using a chip. In one embodiment, the present invention may provide a method for programming a non-volatile memory for use in configuring features of a device. The method may include the steps of beginning a programming cycle; programming mode control bits of the non-volatile memory that correspond to configurations of features of the device; if an interruption occurs during the programming cycle, then rendering the non-volatile memory invalid; and if no interruption occurs during the programming cycle, then rendering the non-volatile memory operational.

In another embodiment, the present invention may provide a method for programming a non-volatile memory for use in configuring features of a device. The method may include the steps of programming a bank of mode control bits of the non-volatile memory that correspond to configurations of features of the device; setting a lock bit associated with the programmed bank of mode control bits; and permanently locking values stored in the bank of mode control bits as a result of setting the associated lock bit.

In yet another embodiment, the present invention may provide a system for programming a non-volatile memory for use in configuring features of a device. The system may include a processor coupled to the non-volatile memory. The processor may be adapted to perform the steps of beginning a programming cycle on a first set of bits of the nonvolatile memory; one-time programming mode control bits of the first set of the non-volatile memory that correspond to configurations of features of the device; if an interruption occurs during the programming cycle, then rendering the non-volatile memory invalid; and if no interruption occurs during the programming cycle, then rendering the non-volatile memory operational.

These and other features and advantages of the present invention may be appreciated from a review of the following detailed description of the present invention, along with the accompanying figures in which like reference numerals refer to like parts throughout.

DETAILED DESCRIPTION OF THE INVENTION

Figure 1:
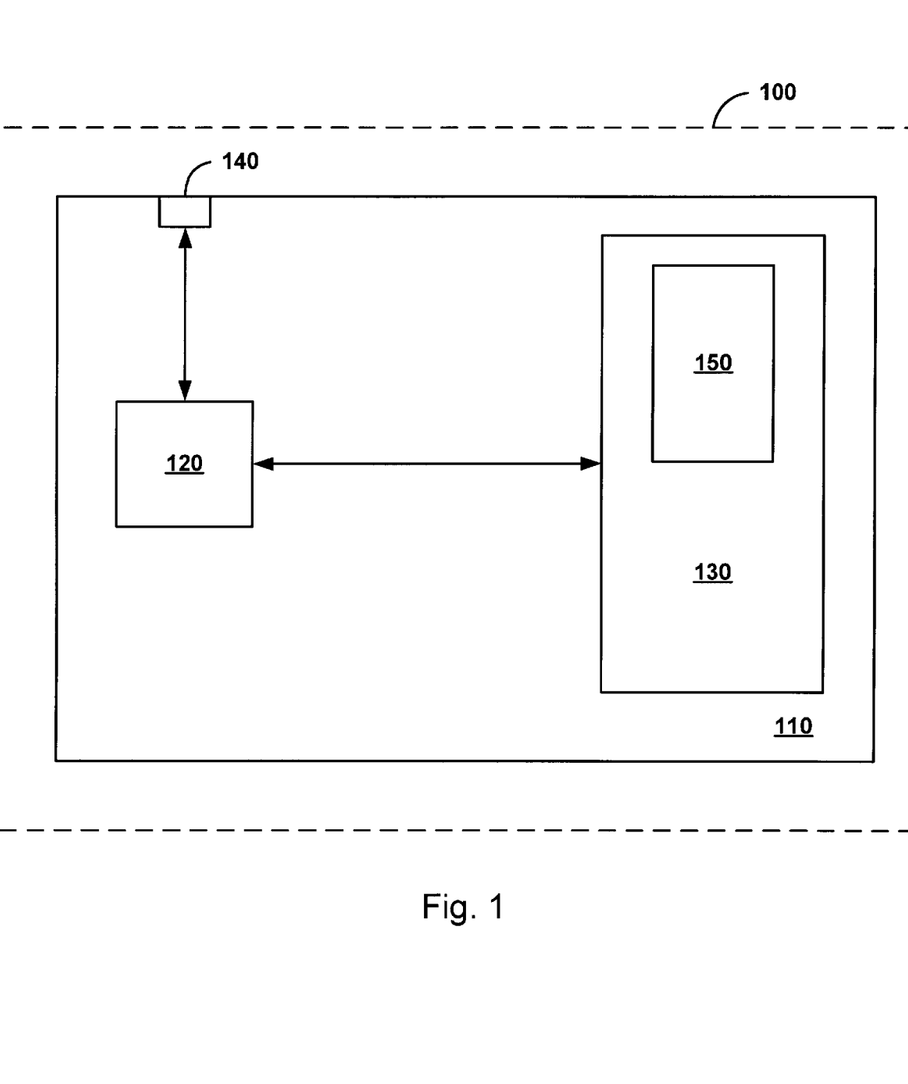
FIG. 1 shows an example of a device including a chip according to the present invention.

FIG. 1 shows an example of a device 100 including a chip 110 according to the present invention. Although the chip 110 is illustrated as part of the device 100, it may be external to the device 100 and merely coupled to the device 100. The chip 110 may include a processor 120, a memory array 130 and a chip interface 140. The memory array 130 may include a non-volatile memory 150 such as, for example, a one-time programmable nonvolatile memory. The non-volatile memory 150 may include, for example, banks of mode control bits. The processor 120 is coupled to the memory array 130 and the chip interface 140 via buses or other conventional communication means. The device 100 communicates with the chip 110 via, for example, the chip interface 140. In one embodiment, the device 100 is a set top box, for example. Of course, other types of devices are also contemplated by the present invention.

In operation, the non-volatile memory 150 of the memory array 130 can be programmed during a programming cycle or outside of the programming cycle by the processor 120 or by data received by the processor 120 via the chip interface 140. During the programming cycle, a first set of banks of the mode control bits are programmed which correspond to configurations of features or functions of the device 100 that are desired. The first set of banks can be locked out using protection built into the programming cycle. For example, when the programming cycle is complete, subsequent changing of bit values within the first set of banks of the mode control bits can be prohibited.

A second set of banks of the mode control bits can be programmed outside of the programming cycle (e.g., subsequent to the programming cycle completion). The second set of banks of the mode control bits can also be used to program the device 100. The second set of banks may correspond to the same or different features and functions as the first set of banks. Furthermore, the second set of banks may or may not override or cancel out similar features and functions set in the first set of banks during the programming cycle. Once a bank in the second set of banks of the mode control bits is programmed, the locking mechanism corresponding to the respective bank can be programmed to lock the programmed values in the respective bank. For example, one of the bits in the bank can be reserved (e.g., a locking bit) for the locking mechanism such that when the particular bit has been programmed (e.g., a one-time programming of the locking bit resulting in the change from a binary 0 to a binary 1), then the values stored in the respective bank are locked and cannot be modified in the future. Although illustrated as a single bit, one or more bits can be reserved for the locking mechanism of a particular bank. Furthermore, the locking bit or bits need not be part of the respective bank, but can be merely associated with the respective bank. In addition, one or more locking bits can be associated with one or more banks in the second set of banks of the mode control bits.

In some embodiments, the present invention may provide some customers with access to special internal device capabilities (e.g., cases in which the customer has paid the appropriate licensing fee or premium fee), but allow other customers to disable such capabilities or deny access to such capabilities. For example, if a customer desires a special algorithm or a special cryptographic configuration enabled within the device 100, the appropriate mode control bits can be programmed during the programming cycle to enable the desired configurations, features or functions of the device 100; or, if applicable, the appropriate mode control bits can be programmed outside the programming cycle to enable the desired configurations, features or functions of the device 100. If a customer wants to disable a feature or, perhaps, if the customer is not permitted to access such feature, the nonvolatile memory 150 may be so programmed or the device 100 may resort to default values stored in the non-volatile memory 150. Alternatively, the device 100 may not use the nonvolatile memory 150 at all during set up or operation.

The programming cycle or out-of-programming-cycle programming can be initiated, for example, locally at the manufacturing site or at a point of service or can be initiated remotely at a central processing center that can send the appropriate programming data via cables or wirelessly, ultimately reaching the chip interface 140. Such programming data and the transmission thereof may benefit from appropriate security measures (e.g., encryption schemes) and unique identification (e.g., a unique identifier of the device 100 or the chip 110).

Figure 2:
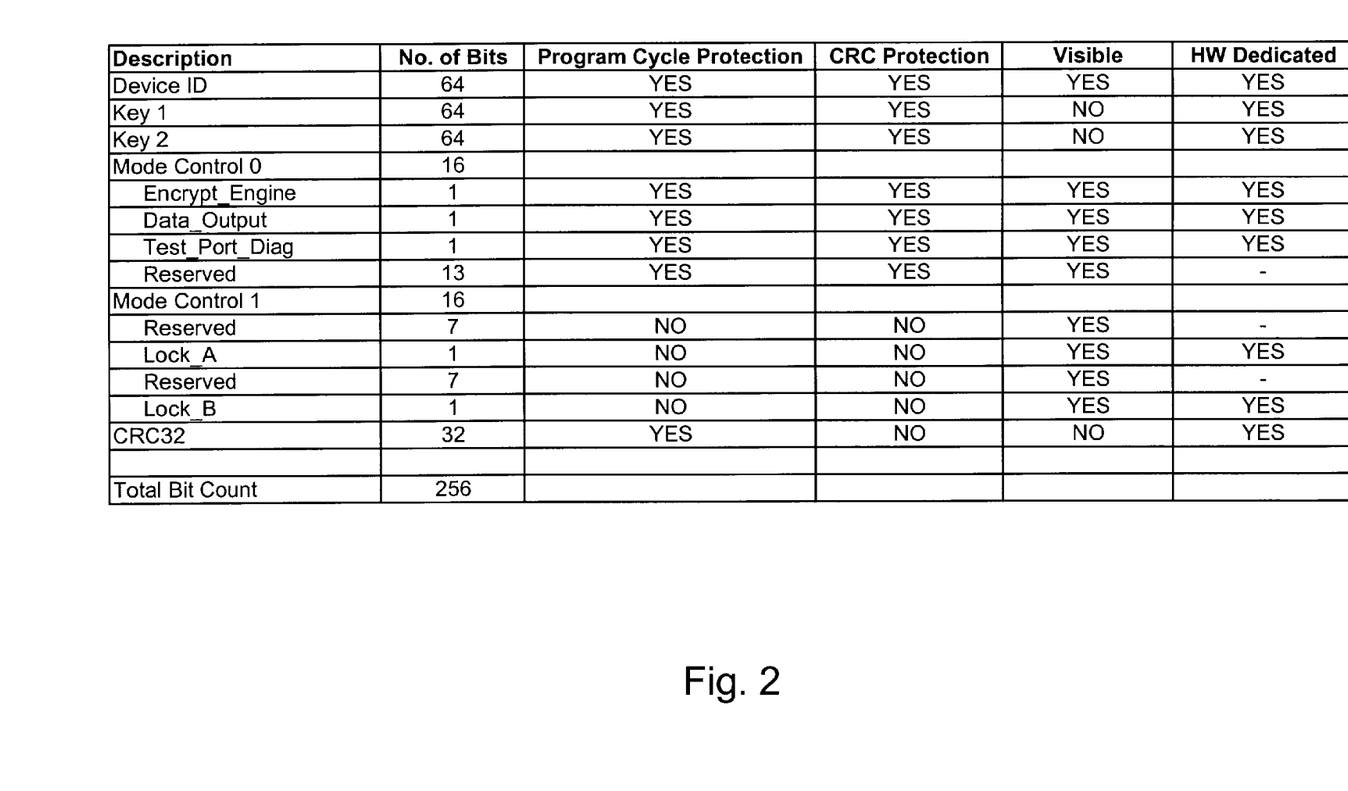
FIG. 2 shows a table illustrating an example of a memory allocation within a nonvolatile memory according to the present invention.

FIG. 2 shows a table illustrating an example of the memory allocation within the nonvolatile memory 150 according to the present invention. The first two columns of the table provide field descriptions and respective bit allocations. The next four columns of the table provide memory bit attributes. Program Cycle Protection indicates whether the memory bits can only be written during a programming cycle and whether the memory bits are locked-out or protected from programming at the completion of the programming cycle. Cyclic Redundancy Check (CRC) Protection indicates whether the memory bits are protected by CRC and whether the memory bits are included in a CRC calculation. For example, CRC32 is a 32-bit CRC calculated on fields starting with the Device ID and continuing through the Mode Control 0 bank of mode control bits. Visible indicates whether the memory bit is readable, for example, by the processor 120, the device 100 or outside of the device 100. Hardware Dedicated indicates whether the bit states are used as part of internal hardware logic or are used only as programmable information bits.

The fields within the non-volatile memory can be generally described as memory data bits, mode control bits and memory management bits. The memory data bits may include, for example, the Device ID, Key 1 and Key 2. Device ID is 64-bits that are visible (i.e., that can be read out by the processor 120) and can provide a unique identifier for the device 100. Key 1 and Key 2 are each 64-bits, not visible outside the device 100 and are used inside the chip 110 as input to cryptographic functions (e.g., data encryption standard (DES) techniques). Additional information relating to cryptography, encryption and other matters can be found in U.S. patent application Ser. No. 09/900,224 entitled "System and Method for the Concealment of Device Input Parameters" to Jeffrey D. Carr which was filed on Jul. 6, 2001, and which is hereby incorporated herein by reference in its entirety.

The mode control bits may include, for example, Mode Control 0 and Mode Control 1. In this example, each bit in the mode control bits may represent a function or feature configuration for the device 100. However, a plurality of bits in the mode control bits may represent one or more function or feature configurations for the device 100. Mode control bits can also be used, for example, to control on board logic in other sections of the device 100.

For example, the Encrypt_Engine mode control bit may have a default value which configures the device 100 for a particular level of encryption or security (e.g., selectable between no encryption, DES or 3DES). When the Encrypt_Engine mode control bit is programmed (e.g., from a binary 0 to a binary 1), the device 100 may be forced into the highest security mode (e.g., 3DES).

In another example, the Data_Output mode control bit may have a default value which enables a data output interface of the device 100. When the Data_Output mode control bit is programmed, the device 100 may disable the data output interface. Similarly, the Test_Port_Diag mode control bit may enable or disable access to test ports of the device 100 depending upon whether the Test_Port_Diag mode control bit stored the default or programmed value.

Lock_A and Lock_B bits may, for example, lockout programming of the respective seven reserved bits of Mode Control 1. The reserved bits may be provided for the selection of features or functions outside of the programming cycle. Accordingly, some of the mode control bits can be locked out after the programming cycle, while other mode control bits can be programmed (e.g., one-time programmed) and locked out by programming the appropriate lockout bit.

Other features and functions of the device 100 that may be configured via the mode control bits include, for example, display, sound or authentication configurations. The above-described features and functions of the device 100 are not intended to be an exhaustive list and may be dependent upon the choice of the device 100. Accordingly, one of ordinary skill in the art can determine additional features and functions of the device 100 (e.g., a set top box) that can be configured by the control mode bits without undue experimentation.

The memory management bits may include, for example, CRC32 and Programming Bits. The CRC32 is a 32-bit result from running the CRC32 algorithm over at least a portion of the non-volatile memory bits such as, for example, the bits which are part of Device ID, Key 1, Key 2 and Mode Control 0. Accordingly, data contents can be validated. The other memory management bits include the Programming Bits, which are, for example, two bits used to indicate the programming status of the device 100. The use of the first Programming Bit (FPB) and the second Programming Bit (SPB) add a hardware layer of protection and security for the programming cycle as will be discussed in greater detail below.

Figure 3:
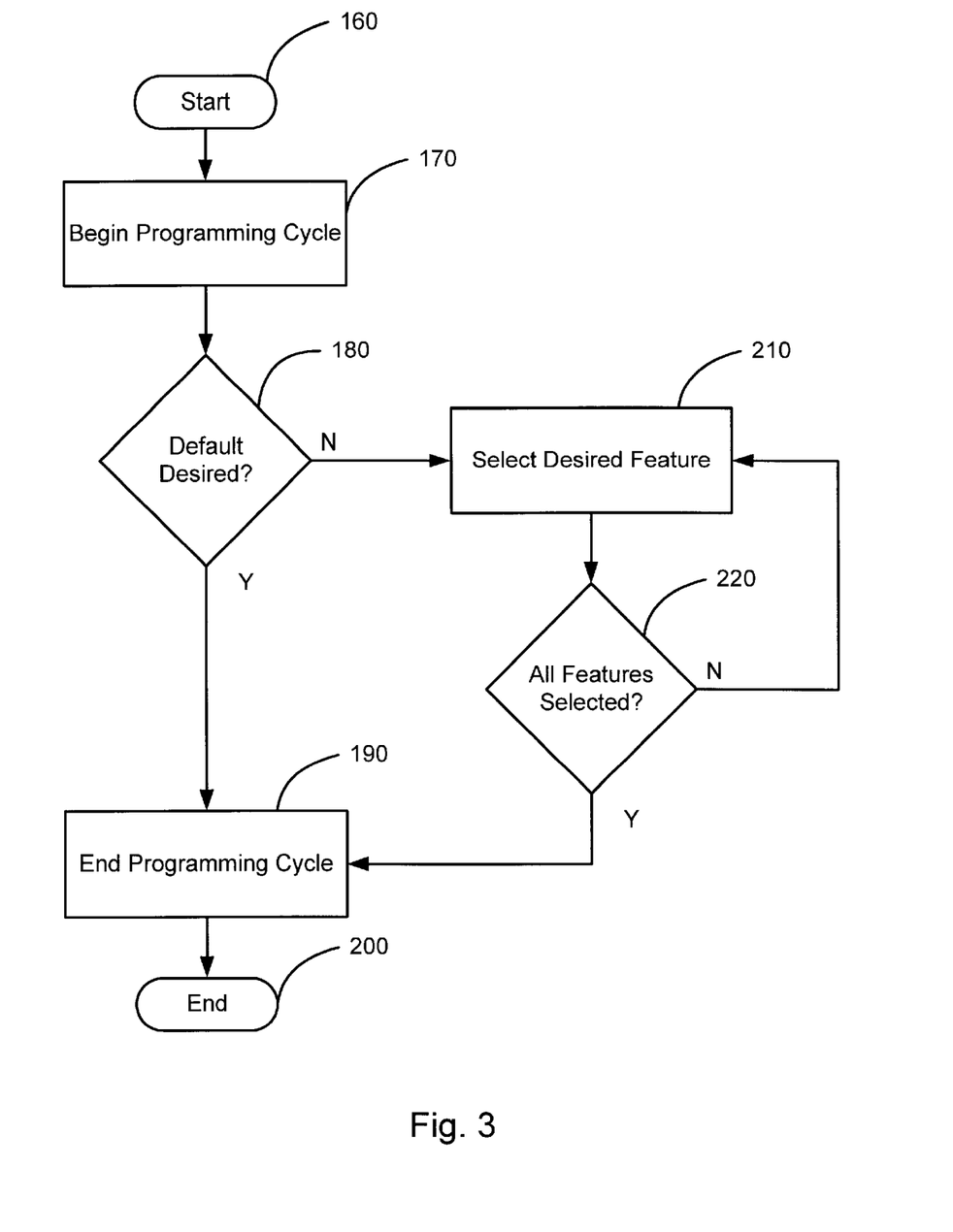
FIG. 3 is a flowchart illustrating an example of a method for programming a nonvolatile memory according to the present invention.

FIG. 3 is a flowchart illustrating an example of a method for programming the nonvolatile memory 150 according to the present invention. The process begins with steps 160 and 170 which include the start of the process and the beginning of the programming cycle, respectively. The beginning of the programming cycle may include the programming of the first of the Programming Bits, which when read by the processor 120, may enable or commence the programming cycle. In query 180, it is determined whether the default values are desired which are already stored in the portion of the non-volatile memory 150 that is affected by the programming cycle. An example of the portion of the non-volatile memory 150 that is affected by the programming cycle is indicated as benefiting from Program Cycle Protection as shown in FIG. 2. The default values may or may not be all binary zeros. If the default values of the portion of the non-volatile memory 150 that is affected by the programming cycle are desired, then the process jumps to step 190. In step 190, the programming cycle ends. The ending of the programming cycle may include the programming of the second of the Programming Bits, which when read by the processor 120, may disable or terminate the programming cycle. With the programming of the second of the Programming Bits, the bits in the non-volatile memory 150 with Program Cycle Protection as set forth, for example, in FIG. 2 can not be further modified. The process ends in step 200.

In query 180, if it is determined that the default values of the portion of the nonvolatile memory 150 that is affected by the programming cycle are not desired, then the process jumps to step 210. In step 210, the device 100 can be configured (i.e., upon successful completion of the programming cycle) for a particular feature or a particular function by programming the corresponding bit or bits in the non-volatile memory 150. For example, the Encrypt_Engine mode control bit can be programmed to force the device 100 into the highest level of encryption security. After selecting a desired feature, the process moves to query 220 in which it is determined whether all of the features desired have been selected. If not, then the selection of additional features of the device 100 continues back at step 210. If all of the desired features have been selected then the process jumps to steps 190 and 200 and the ending of the programming cycle and the ending of the process, respectively, as described above.

Figure 4:
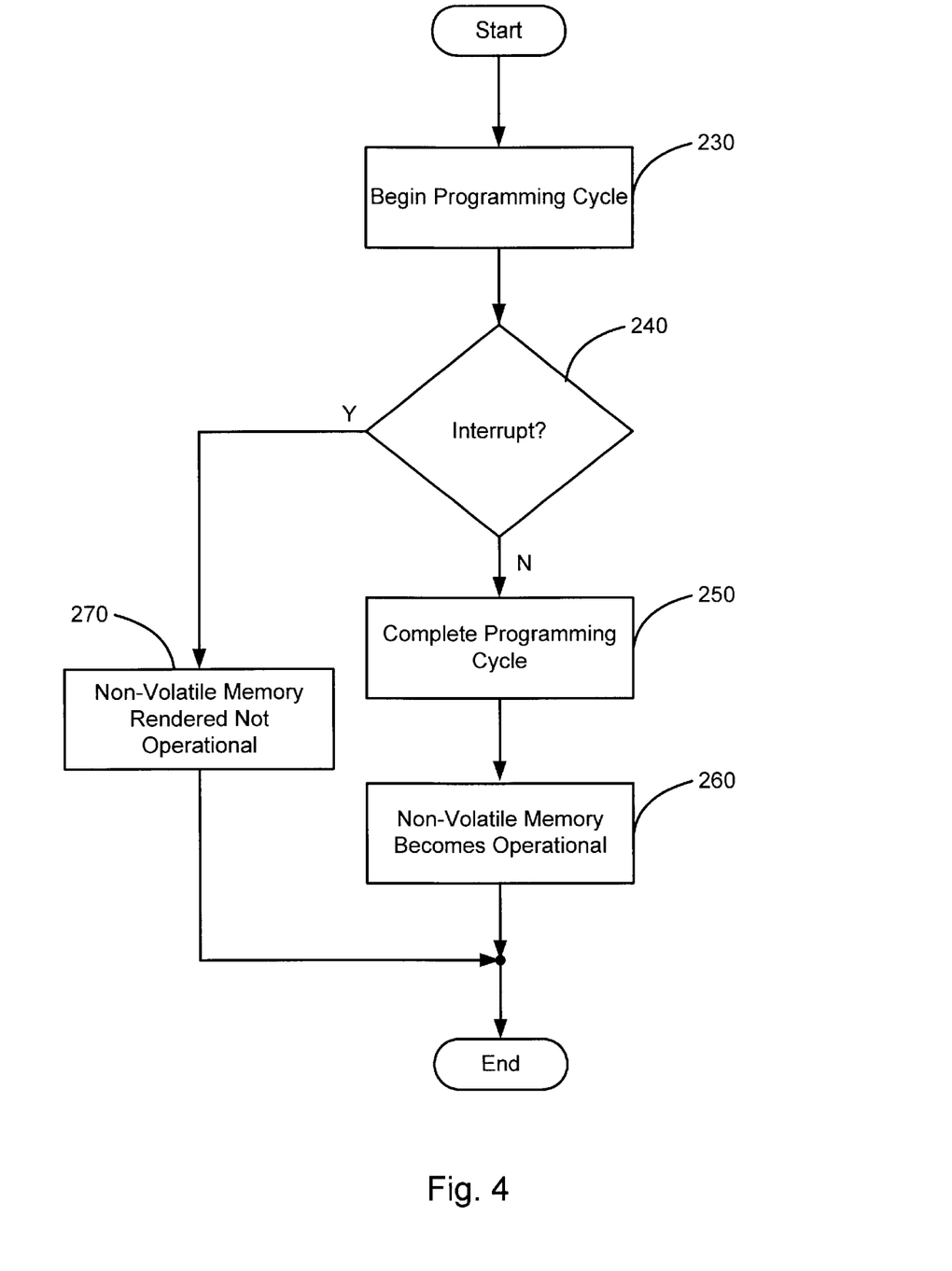
FIG. 4 is a flowchart illustrating an example of a method for programming the nonvolatile memory according to the present invention.

FIG. 4 is a flowchart of an example of a method for programming the non-volatile memory 150 according to the present invention. In step 230, the programming cycle is commenced. The details of the programming cycle have already been described above with respect to, for example, FIG. 3. In query 240, it is determined whether or not an interruption has occurred during the programming cycle. If no interruption has occurred, then the process proceeds to step 250, the completion of the programming cycle. As described above, after a successful programming cycle, both the FPB and the SPB have programmed values (e.g., both will have binary ones stored in the respective bits, the "11" state). As a result of both the FPB and the SPB being successfully programmed, in step 260, the non-volatile memory 150 becomes operational and the device 100 can be configured according to the accessible values programmed in the non-volatile memory 150.

If an interruption does occur during the programming cycle, then the process proceeds to step 270 in which the non-volatile memory is rendered invalid or not operational. Since an interruption occurred, the Programming Bits are not both programmed and, as a result, the non-volatile memory 150 is not operational. Interruptions during the programming cycle may also be caused, for example, by reset conditions or loss of power. For example, if a loss of power occurs during the programming cycle, then the FBP is programmed and the SPB is not programmed (e.g., the "10" state), resulting in the read access to the non-volatile memory 150 being disabled. Under such a condition, the nonvolatile memory 150 will not allow any further programming and will be rendered permanently invalid (i.e., cannot be accessed). In one example, an invalid non-volatile memory is permanently placed in reset mode causing the processor 210 to reset or reboot.

The case in which the FPB is not programmed and the SPB is programmed (e.g., the "01" state) is an illegal state and should not occur. If either the "10" state or the "01" state does occur as the device 100 comes up from reset or during normal operation, it may be assumed that the non-volatile memory 150 was not programmed correctly or that the nonvolatile memory 150 was improperly tampered with. In either case, access to the nonvolatile memory 150 is disabled. The mode controls may also be enabled to their most secure state (e.g., programmed to binary ones).

As discussed above, the non-volatile memory 150 can also have a second set of banks of memory control bits that are not programmable during the programming cycle. Thus, for example, as illustrated in FIG. 2, the first seven bits of the Mode Control 1 bits may be programmable (e.g., one-time programmable) outside of the programming cycle and, once programmed, may be locked in value by the programming of a lock bit such as Lock_A, for example. A similar relationship may be found between the next seven bits of the Mode Control 1 bits and the Lock_B bit.

Figure 5:
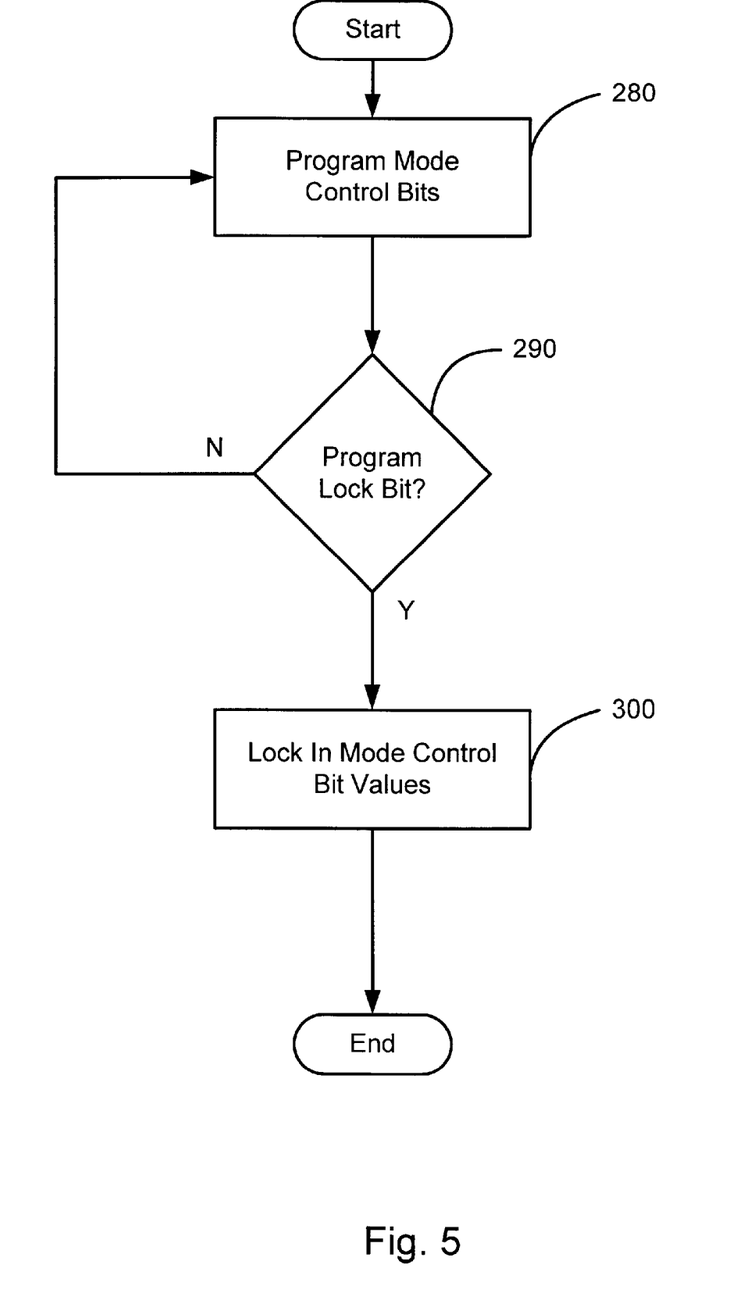
FIG. 5 is a flowchart of an example of a method for programming the non-volatile memory according to the present invention.

FIG. 5 is a flowchart of an example of a method for programming the non-volatile memory 150 according to the present invention. Some mode control bits (e.g., Mode Control 1 bits) are not programmed during the programming cycle as set forth in FIG. 3. Thus, after a successful programming cycle in which the some of the mode control bits are programmed and locked in their states, a second set of banks of mode control bits can still be programmed (step 280). In query 290, it is determined whether or not the locking bit associated with a respective bank of the second set has been programmed. If the locking bit has not yet been programmed, then the respective bank can still be programmed and the process jumps back to step 280. In one example, if the respective bank is one-time programmable and all of the bits in the respective bank have been programmed, then the process ends. Since the bits are only one-time programmable, the bits cannot be further programmed. In query 290, if it is determined that the locking bit has been programmed, then the respective bank has its bit values locked in (step 300). Thus, the respective bank cannot be further modified or programmed.

Thus, it is seen that systems and methods for programming non-volatile memory are provided. One skilled in the art will appreciate that the present invention can be practiced by other than the preferred embodiments which are presented in this description for purposes of illustration and not of limitation, and that the present invention is limited only by the claims that follow. It is noted that equivalents for the particular embodiments discussed in this description may practice the present invention as well.

What is claimed is:

1. A method for programming a non-volatile memory for use in configuring features of a device, comprising the steps of:

(a) beginning a programming cycle;

(b) programming mode control bits of the non-volatile memory that correspond to configurations of features of the device;

(c) if an interruption occurs during the programming cycle, then rendering the non-volatile memory invalid; and (d) if no interruption occurs during the programming cycle, then rendering the non-volatile memory operational.

2. The method according to claim 1, wherein the interruption is a reset condition.

3. The method according to claim 1, wherein the interruption is a power loss condition.

4. The method according to claim 1, wherein the step of rendering the nonvolatile memory invalid includes the step of making the non-volatile memory inaccessible.

5. The method according to claim 1, wherein the step of rendering the nonvolatile memory invalid comprises placing the non-volatile memory in a reset condition.

6. The method according to claim 1, wherein the step of rendering the nonvolatile memory operation comprises accessing the values stored in the non-volatile memory by the device.

7. The method according to claim 1, wherein the step (d) comprises, if no interruption occurs during the programming cycle, then finishing the programming cycle.

8. The method according to claim 7, wherein the step of finishing the programming cycle comprises programming an end bit that permanently disables the programming cycle and permanently locks values in the non-volatile memory for bits that could have been programmed during the programming cycle.

9. The method according to claim 1, wherein the step of beginning the programming cycle comprises programming a start bit that enables the programming cycle.

10. A method for programming a non-volatile memory for use in configuring features of a device, comprising the steps of:

programming a bank of mode control bits of the non-volatile memory that correspond to configurations of features of the device;

setting a lock bit associated with the programmed bank of mode control bits; and permanently locking values stored in the bank of mode control bits as a result of setting the associated lock bit.

11. The method according to claim 10, wherein the bank of mode control bits are one-time programmable.

12. The method according to claim 10, wherein the lock bit can be set only once.

13. The method according to claim 10, wherein each bit of the bank of mode control bits corresponds to a respective feature of the device.

14. A system for programming a non-volatile memory for use in configuring features of a device, comprising:

a processor coupled to the non-volatile memory, the processor adapted to perform the steps of
beginning a programming cycle on a first set of bits of the non-volatile memory,
one-time programming mode control bits of the first set of bits of the non-volatile memory that correspond to configurations of features of the device,
if an interruption occurs during the programming cycle, then rendering the non-volatile memory invalid, and
if no interruption occurs during the programming cycle, then rendering the non-volatile memory operational.

15. The system according to claim 14, wherein the non-volatile memory includes a first programming bit and a second programming bit, wherein the first programming bit is programmed to enable the programming cycle, and wherein the second programming bit is programmed to disable the programming cycle.

16. The system according to claim 14, wherein the non-volatile memory includes a second set of bits of the non-volatile memory that cannot be programmed during the programming cycle, wherein the second set of bits includes a second set of mode control bits and an associated locking bit, wherein, if the associated locking bit is not programmed, then the second set of mode control bits can be programmed, and wherein, if the associated locking is programmed, then the second set of mode control bits can no longer be programmed.

* * * * *